United States Patent
Chuang et al.

(10) Patent No.: US 9,512,519 B2
(45) Date of Patent: Dec. 6, 2016

(54) ATOMIC LAYER DEPOSITION APPARATUS AND METHOD

(71) Applicant: Taiwan Semiconductor Manufacturing Company, Ltd., Hsinchu (TW)

(72) Inventors: Chia-Yi Chuang, Taipei (TW); Hsing-Jui Lee, Hsinchu (TW); Ming-Te Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/692,972

(22) Filed: Dec. 3, 2012

(65) Prior Publication Data

US 2014/0154414 A1    Jun. 5, 2014

(51) Int. Cl.
| | | |
|---|---|---|
| *C23C 16/455* | (2006.01) | |
| *C23C 16/458* | (2006.01) | |
| *C23C 16/46* | (2006.01) | |
| *C30B 25/14* | (2006.01) | |
| *C30B 31/16* | (2006.01) | |
| *H01J 37/32* | (2006.01) | |

(Continued)

(52) U.S. Cl.
CPC ....... *C23C 16/45548* (2013.01); *C23C 16/455* (2013.01); *C23C 16/4583* (2013.01); *C23C 16/45527* (2013.01); *C23C 16/45546* (2013.01); *C23C 16/45574* (2013.01); *C23C 16/45578* (2013.01); *C23C 16/46* (2013.01); *C30B 25/14* (2013.01); *C30B 31/16* (2013.01); *H01J 37/3244* (2013.01); *H01L 21/0228* (2013.01); *H01L 21/3141* (2013.01)

(58) Field of Classification Search
CPC .................. C23C 16/45502; C23C 16/45508; C23C 16/45523–16/45555; C23C 16/455–16/4551; C23C 16/45561; C23C 16/45563–16/4558; C23C 16/45587–16/45591; C23C 16/4582–16/4586; H01L 21/28562; H01L 29/517; H01L 21/02255; H01L 21/02263; H01L 21/02271; H01L 21/0228; H01L 21/0262; H01L 21/3141; H01L 21/67103; H01L 21/67207; H01L 21/673; H01L 21/67303–21/67309; H01L 21/6732; H01L 21/67346; H01L 31/1876; C30B 25/02; C30B 31/16; C30B 31/06; C30B 25/12; C30B 25/14; C30B 25/165; F27B 17/0025; H01J 37/3244; H01J 37/32522; H01J 37/32779
USPC ..... 118/715, 719, 720, 728, 729; 156/345.1, 156/345.27, 345.33, 345.37, 345.51, 345.52

See application file for complete search history.

(56) References Cited

U.S. PATENT DOCUMENTS 4,096,822 A * 6/1978 Yamawaki et al. ........... 118/729
4,183,320 A * 1/1980 Erben et al. .................. 118/725
(Continued)

OTHER PUBLICATIONS

M. Leskelä, M. Ritala, "Atomic Layer Deposition Chemistry: Recent Developments and Future Challenges," Angew. Chem. Int. Ed. 42 (45) (2003) 5548-5554.*

*Primary Examiner* — Parviz Hassanzadeh
*Assistant Examiner* — Stanislav Antolin
(74) *Attorney, Agent, or Firm* — Slater Matsil, LLP

(57) ABSTRACT

An atomic layer deposition apparatus includes a chamber including a plurality of regions; and a heating device respec-
(Continued)

tively providing specific temperature ranges for the plurality of regions.

18 Claims, 7 Drawing Sheets

(51) Int. Cl.
  *H01L 21/02* (2006.01)
  *H01L 21/314* (2006.01)

(56) References Cited

U.S. PATENT DOCUMENTS

| | | | | |
|---|---|---|---|---|
| 5,164,012 | A * | 11/1992 | Hattori | 118/725 |
| 5,338,362 | A * | 8/1994 | Imahashi | C23C 16/54 118/719 |
| 5,925,188 | A * | 7/1999 | Oh | 118/715 |
| 6,074,486 | A * | 6/2000 | Yang et al. | 118/719 |
| 6,435,865 | B1 * | 8/2002 | Tseng et al. | 432/152 |
| 6,527,866 | B1 * | 3/2003 | Matijasevic et al. | 118/719 |
| 6,746,240 | B2 * | 6/2004 | De Ridder | H01L 21/67098 432/241 |
| 6,962,859 | B2 * | 11/2005 | Todd | B82Y 10/00 427/255.18 |
| 2002/0134507 | A1 * | 9/2002 | DeDontney et al. | 156/345.33 |
| 2003/0087108 | A1 * | 5/2003 | Herner et al. | 428/446 |
| 2003/0111013 | A1 * | 6/2003 | Oosterlaken | C23C 16/22 118/724 |
| 2003/0119288 | A1 * | 6/2003 | Yamazaki et al. | 438/565 |
| 2003/0186517 | A1 * | 10/2003 | Takagi | 438/478 |
| 2004/0025786 | A1 * | 2/2004 | Kontani et al. | 118/715 |
| 2004/0067641 | A1 * | 4/2004 | Yudovsky | C23C 16/4412 438/680 |
| 2004/0142558 | A1 * | 7/2004 | Granneman | 438/680 |
| 2004/0250853 | A1 * | 12/2004 | Snijders | B01J 4/02 137/240 |
| 2005/0045102 | A1 * | 3/2005 | Zheng et al. | 118/722 |
| 2005/0118837 | A1 * | 6/2005 | Todd | C23C 16/24 438/791 |
| 2006/0060137 | A1 * | 3/2006 | Hasper | C23C 16/34 118/715 |
| 2006/0088985 | A1 * | 4/2006 | Haverkort | C23C 16/24 438/479 |
| 2006/0159847 | A1 * | 7/2006 | Porter et al. | 427/248.1 |
| 2006/0166501 | A1 * | 7/2006 | Kaushal et al. | 438/685 |
| 2006/0196418 | A1 * | 9/2006 | Lindfors et al. | 118/715 |
| 2007/0034158 | A1 * | 2/2007 | Nakaiso | 118/725 |
| 2007/0215036 | A1 * | 9/2007 | Park | C23C 16/45551 117/88 |
| 2007/0218702 | A1 * | 9/2007 | Shimizu | C23C 16/06 438/758 |
| 2007/0234953 | A1 * | 10/2007 | Kaushal et al. | 118/323 |
| 2008/0035055 | A1 * | 2/2008 | Dip et al. | 118/715 |
| 2008/0083372 | A1 * | 4/2008 | Inoue et al. | 118/725 |
| 2008/0208385 | A1 * | 8/2008 | Sakamoto et al. | 700/121 |
| 2008/0286981 | A1 * | 11/2008 | Hasper | C23C 16/34 438/762 |
| 2009/0042404 | A1 * | 2/2009 | Surthi | 438/770 |
| 2009/0130829 | A1 * | 5/2009 | Noda et al. | 438/503 |
| 2009/0246971 | A1 * | 10/2009 | Reid et al. | 438/778 |
| 2010/0050942 | A1 * | 3/2010 | Kato | C23C 16/401 118/730 |
| 2010/0317174 | A1 * | 12/2010 | Noda et al. | 438/478 |
| 2011/0186984 | A1 * | 8/2011 | Saito et al. | 257/734 |
| 2012/0076936 | A1 * | 3/2012 | Hirano | 427/248.1 |
| 2012/0156886 | A1 * | 6/2012 | Shirako et al. | 438/706 |
| 2012/0222620 | A1 * | 9/2012 | Yudovsky | C23C 16/45551 118/725 |
| 2012/0315767 | A1 * | 12/2012 | Sasaki et al. | 438/758 |
| 2012/0321786 | A1 * | 12/2012 | Satitpunwaycha | C23C 16/45565 427/252 |

* cited by examiner

10

ATOMIC LAYER DEPOSITION APPARATUS AND METHOD

FIELD

The present disclosure relates to an atomic layer deposition apparatus and method. More particularly, it relates to an atomic layer deposition apparatus having a plurality of regions and a heating device for respectively providing specific temperature ranges for the plurality of regions.

BACKGROUND

An atomic layer deposition (ALD) process is a well known deposition technique in the semiconductor industry. The ALD process employs a precursor material which can react with or chemisorb on a surface in process to build up successively deposited layers, each of which layers being characterized with thickness about only one atomic layer. Subject to properly selected process conditions, the chemisorption reaction has a self-limiting characteristic, meaning that the amount of precursor material deposited in every reaction cycle is constant and the precursor material is restricted to growing on the surface, and therefore the film thickness can be easily and precisely controlled by the number of the applied growth cycles.

Conventionally, a batch of ALD process usually consists of multiple ALD reaction cycles, each of which ALD reaction cycles involves consequently performing steps of introducing a first gaseous precursor pulse to a surface in process, pulsing an inert gas to purge or evacuate the excess gaseous precursor after the surface is saturated with an atomic layer of the first gaseous precursor, pulsing a second gaseous precursor and purging by an inert gas pulse or evacuating. A single ALD reaction cycle is continuously repeated until a target thickness for the deposited atomic layer on the surface in process is achieved.

The conventional ALD process is widely applicable for growing a thin film, such as a high-k dielectric layer, a diffusion barrier layer, a seed layer, a sidewall, a sidewall oxide, a sidewall spacer for a gate, a metal interconnect and a metal liner etc., in a semiconductor electronic element.

Often, the conventional ALD process is implemented in a furnace, and one batch of ALD process can only form one scale of thickness for an ALD layer on a substrate or a wafer in the furnace. However, for example, there usually exist five different thicknesses in a range from 20A, 25A, 30A, 40A to 43A needed to be formed for sidewall oxidations in one semiconductor device.

Thus, there arises a difficulty to reach full batch control, for example one hundred and twenty-five pieces, since a sidewall stage would require four hours of quality check time for defect reduction. The factors stated above lead to a limitation on the efficiency of ALD for wafer capacity utilization currently, while the quantity of the same thickness of wafer in process (WIP) would be lower than fifty pieces in comparison with the full batch load. This will cause unsatisfactory tool efficiency, and a corresponding low WIP performance will degrade the tool efficiency as well.

However, the ALD process for the batch load with respect to currently uniform size injectors located within the chamber is not yet good enough to be satisfactory, failing to overcome a series of issues related to handling different layer deposition thicknesses for different wafers of the load batch when different reaction cycles are used to elevate the capacity utilization of the batch load within the chamber vacuum furnace.

In addition, full batch control, which includes one hundred and twenty five wafers in process, is difficult due to the sidewall oxidation stage requiring four hours of Q-time (quality time) for defect reduction. Currently, only fifty pieces having same wafer thickness can be in process, which causes poor tool efficiency as well.

There is a need to solve the above deficiencies/issues.

SUMMARY

In an atomic layer deposition apparatus, the atomic layer deposition apparatus includes a chamber and a heating device. The chamber includes a plurality of regions. The heating device respectively provides specific temperature ranges for the plurality of regions.

In an atomic layer deposition apparatus, the atomic layer deposition apparatus includes an injector. The injector has a first hole and a second hole. The first hole has a first geometric parameter. The second hole has a second geometric parameter different from the first geometric parameter.

In an atomic layer deposition process, the atomic layer deposition includes providing a chamber and injecting at least two depositing materials. The chamber has a plurality of regions. The at least two depositing materials is injected into respective ones of the plurality of regions.

DESCRIPTION OF THE DRAWINGS

A more complete appreciation of the invention and many of the attendant advantages thereof are readily obtained as the same become better understood by reference to the following detailed description when considered in connection with the accompanying drawing, wherein.

DETAILED DESCRIPTION

Figure 1:
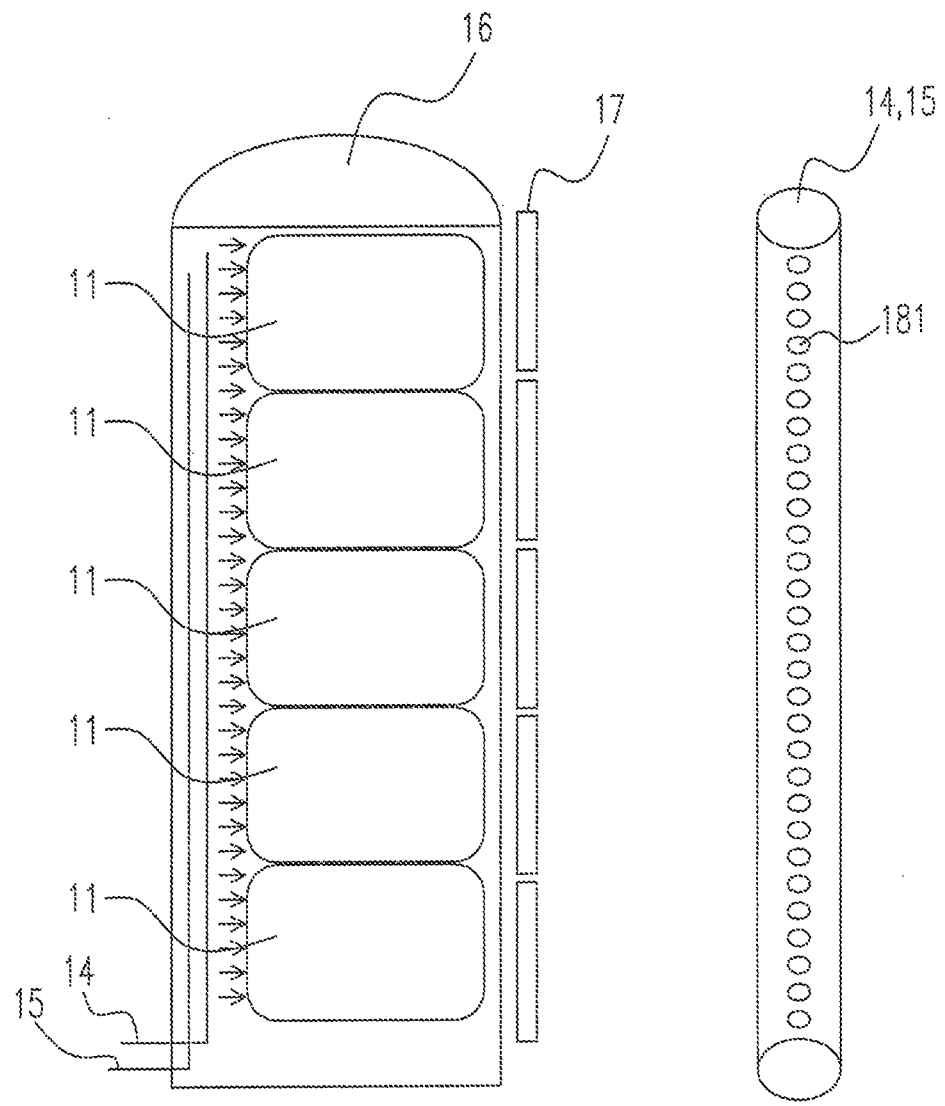
FIG. 1 is a schematic diagram illustrating a full batch load operation in the atomic layer deposition apparatus in accordance with the present disclosure.

The present disclosure will be described with respect to particular embodiments and with reference to certain drawings, but the disclosure is not limited thereto but is only limited by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "including", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device including means A and B" should not be limited to devices consisting only of components A and B.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments may be practiced without these specific details. In other instances, well-known methods, structures and techniques have not been shown in detail in order not to obscure an understanding of this description.

The disclosure will now be described by a detailed description of several embodiments. It is clear that other embodiments can be configured according to the knowledge of persons skilled in the art without departing from the true technical teaching of the present disclosure, the claimed disclosure being limited only by the terms of the appended claims.

Figure 2:
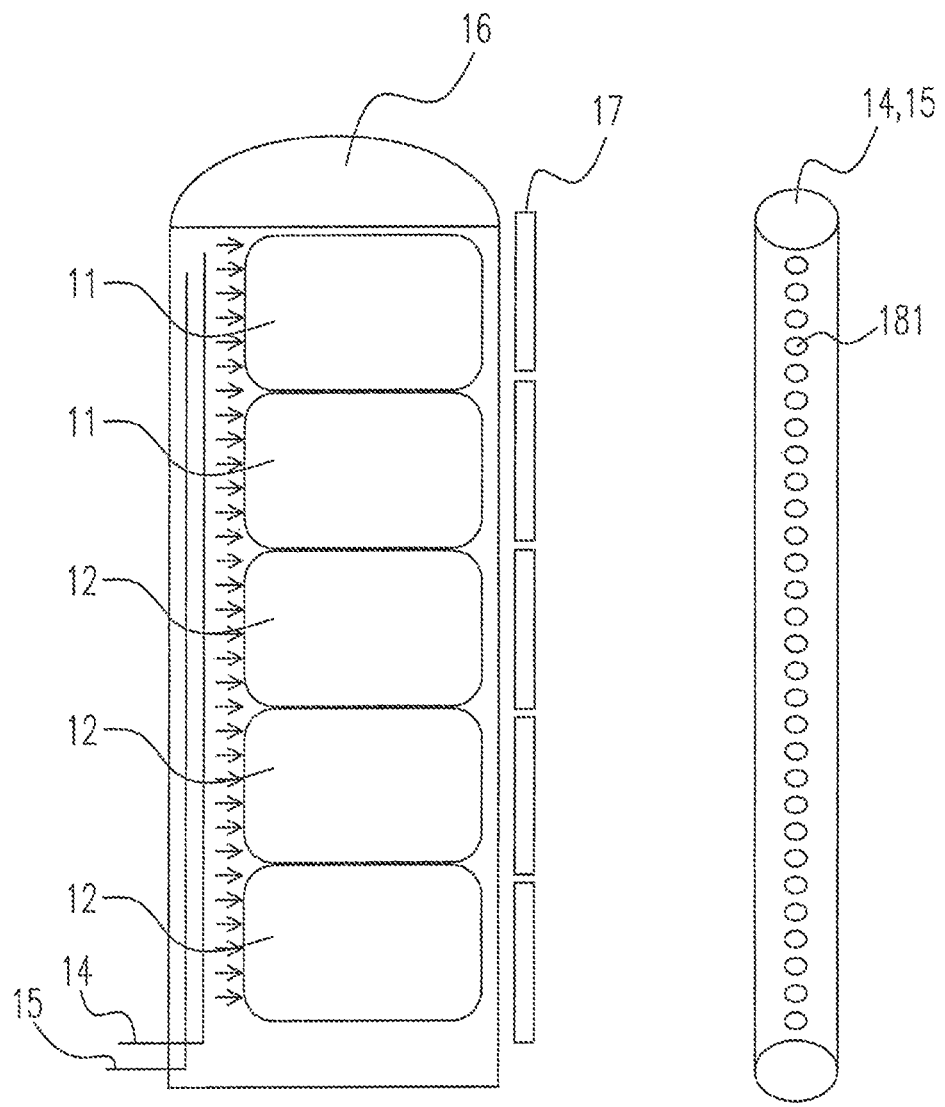
FIG. 2 is a schematic diagram illustrating a partial full batch load operation in the atomic layer deposition apparatus in accordance with the present disclosure.
Figure 3:
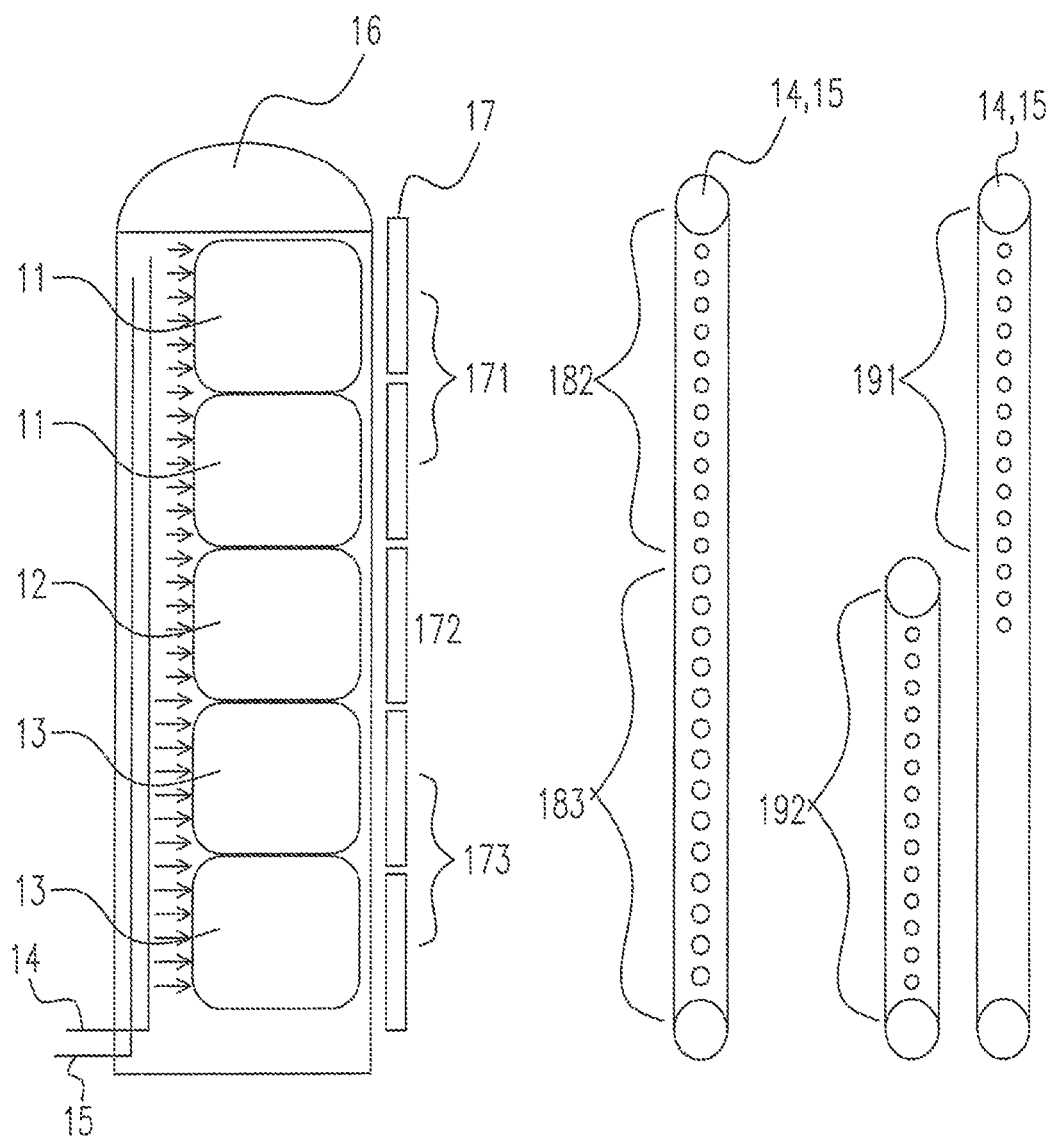
FIG. 3 is a schematic diagram illustrating a full batch load capable of forming with two different thicknesses of deposition layers in one ALD batch in accordance with the present disclosure.

Referring now to FIGS. 1 to 3, an atomic layer deposition apparatus for performing atomic layer deposition processing in accordance with various embodiments of the present disclosure is shown. Injectors 14 and 15 are used for transporting different precursor materials required for performing the atomic layer deposition (ALD), for forming a thin film having a uniform thickness on a top surface of the wafer substrate in a single batch process.

In FIGS. 1 and 2, a series of holes 181 with the same geometric radius are arranged from a bottom side to a top side and open on a pipe wall of both injectors 14 and 15. In some embodiments, the respective injector can have a diameter of about 25 mm, holes of about 1 mm or preferably 3 mm in diameter and a total of 40 holes for a total hole cross-sectional area of about 282 mm$^2$ etc.

The ALD process is commonly applied to form structures such as a high-k dielectric layer, an interconnect barrier layer, a sidewall oxide and a deposition layer in a porous structure, etc. For example, in a formation of a high-k dielectric layer, for forming films such as an $Al_2O_3$ film, a $HfO_2$ film and a $ZrO_2$ film acting as a high-k dielectric layer, corresponding candidate precursor material pair can be chosen as $Al(CH_3)_3$ plus either $H_2O$ or $O_3$, either $HfCl_4$ or TEMAH plus $H_2O$ and $ZrCl_4$ plus $H_2O$. $H_2O$ may be a popular candidate for acting as a precursor material since H2O vapor is adsorbed on most materials or surfaces including a silicon surface of a wafer face.

FIG. 1 illustrates a full batch load operation in the atomic layer deposition apparatus in accordance with the present disclosure. The ALD apparatus used in the ALD process includes a furnace 16 having a vacuum chamber divided into multiple regions 11, for example, five regions 11, and a heating device 17 configured in proximity to the multiple regions 11 for providing and tuning specific temperature ranges for the multiple regions 11, respectively, for forming a one-heater-for-multiple-region configuration or a multiple-region-per-heater configuration. In some embodiments, the heating device 17 is configured as including multiple heaters, each of which heaters corresponds respectively to one of the multiple regions 11, for forming a one-heater-per-region configuration. In some embodiments, a multiple-heater-per-region configuration is accordingly derived. The ALD apparatus further includes dual or more injectors 14 and 15 having multiple holes 181 and configured in the vacuum chamber.

In some embodiments, the five regions 11 are fully loaded with wafers in process, which results in relatively high capacity utilization. During one batch ALD process, precursors A and B in gaseous state are alternatively introduced into the furnace 16 through the injectors 14 and 15 to form a deposited film with thickness A onto multiple wafers being placed in each region 11. Deposition rate is related to temperature. To achieve a uniform deposition rate, the temperatures in the five regions 11 are controllable by the heating device 17.

Referring to FIG. 2, a schematic diagram illustrating a partially full batch load operation in the atomic layer deposition apparatus in accordance with the present disclosure is shown. In some embodiments, one batch of conventional ALD processing only forms one scale of thickness for the sidewall oxide, so that the processing capacity for the one batch of ALD processing may not be fully loaded with wafers in process and some dummy regions 12 may be empty or partially loaded with wafers in process. But, for instance, there may exist five different scales of thicknesses required to be formed for the sidewall oxide in a semiconductor device, thus the productivity and the capacity utilization performance for the overall ALD process has to be improved. In some embodiments, one batch of ALD process forms at least two scales of different thicknesses for a deposited layer, for example a sidewall oxide. In some embodiments, the configuration is the same as that of FIG. 1, differing only in that two regions 11 are fully loaded with wafers in process, and the other three dummy regions 12 are empty, which results in relatively low capacity utilization.

In some embodiments of the invention, region temperature tuning and hole size optimization of the injector are utilized to improve atomic layer deposition efficiency. The atomic layer deposition process tool shown in FIGS. 1 and 2 handles two different wafer deposition thicknesses in a single cycle of the batch deposition to increase efficiency measured up to 90%, while the daily throughput approaches around three hundred pieces.

FIG. 3 is a schematic diagram illustrating a full batch load capable of forming two deposition layers of different thicknesses in one ALD batch in accordance with the present disclosure. The injectors 14 and 15 have multiple first holes 182 having a first radius dimension and multiple second holes 183 having a second radius dimension, and can emit gaseous deposition materials at different discharge rates, labeled by two different types of arrows shown in FIG. 3, to produce two sets of thicknesses: thickness A for regions 11 and thickness B for regions 13. Region 12 is a dummy region acting as a buffer region possibly exhibiting imprecise separation of the two different thicknesses of the deposition regions within the chamber. The heaters 17 are distinguished into three different temperature control sections, such that a first section 171, a second section 172 and a third section 173 are capable of providing different temperatures. The first section provides a first temperature in the two regions 11 for growing a film with thickness A on the wafer. The second section 172 provides a second temperature in the buffer region 12. The third section 173 provides a third temperature in the two regions 13 for growing a film with thickness B on the wafer. The first, second, and third temperatures may be all different or all the same, or two of the first, second, and third temperatures may be the same, and one of the temperatures different from the two same temperatures. Number of temperature control sections is not limited to three herein, and more or fewer temperature control sections may be used (e.g., 2 temperature control sections, or more than 3 temperature control sections).

Another effect which needs to be considered while forming two or more scales of different thicknesses for deposition layers in one batch of ALD processing arises from the fact that a relatively thicker layer may require relatively longer processing time. Hence, a dummy reaction cycle is introduced in some embodiments for the regions used for processing depositing of a relatively thinner layer, so as to align the different processing times for respective relatively thicker and thinner layers. Finally, the multiple different processing times for the respective scales of different thicknesses for deposition layers can be aligned and the respective relatively thicker and thinner layers are finished at the same time at the end of the batch of ALD processing.

Figure 4:
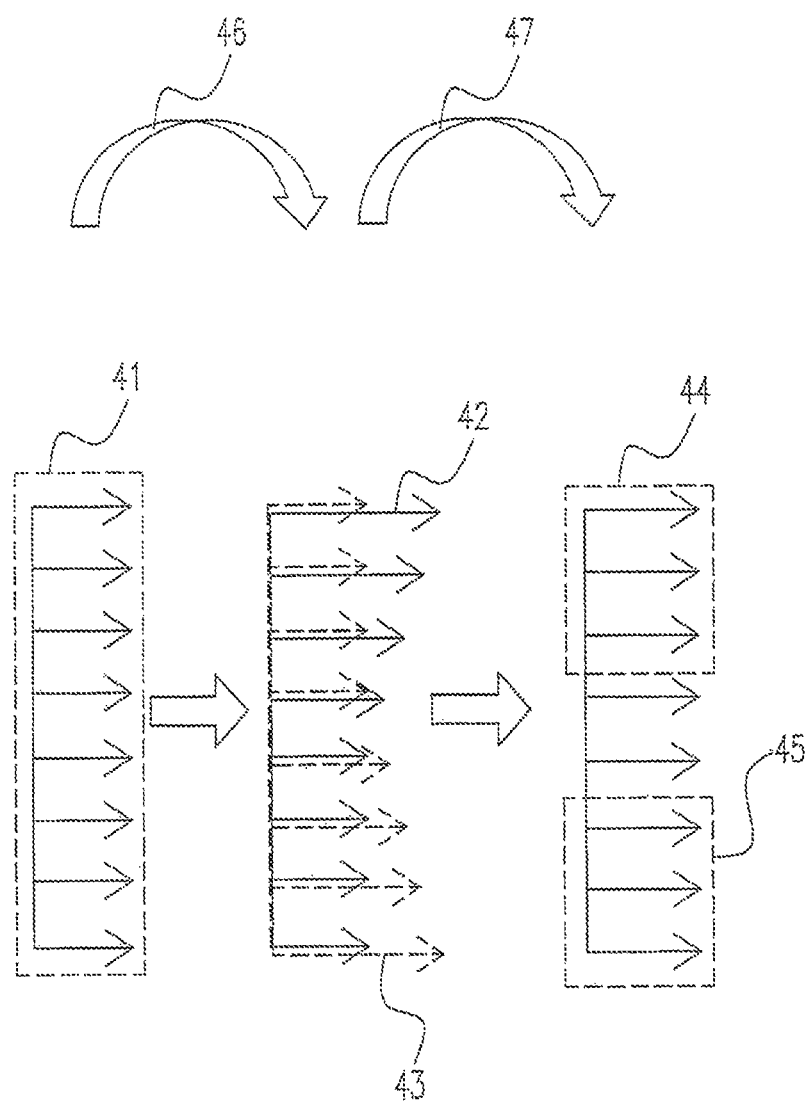
FIG. 4 is a schematic diagram illustrating the injection rate of precursors having two radiuses of holes and temperature tuning compensation of the invention in accordance with the present disclosure.

FIG. 4 is a schematic diagram illustrating injection rates of precursor holes having at least two radius dimensions in the same injector in combination with the temperature tuning compensation scheme for the atomic layer deposition in accordance with the present disclosure. In a stage 46, a first emitting precursor material having a speed profile 42 for forming films with thickness A is emitted from the holes with first radius dimension 182 on the injectors 14 and 15 and deposited onto the wafer, and a second emitting precursor material having a speed profile 43 for forming films with thickness B is emitted from the holes with second radius dimension 183 on the injectors 14 and 15 and deposited onto the wafer. The speed profiles 42 and 43 for the first and second emitting materials are then merged to form two different thickness films in one batch cycle, and to replace a conventional emitting material 41 for forming a single thickness film in one batch cycle. In a stage 47, the heater 17 capable of providing different temperatures respectively to the speed profiles 42 and 43 for the multiple emitting materials is involved to fine tune respective non-uniform and discrete speed profiles 42 and 43 for the first and second emitting materials to be aligned and integrally formed into an even profile. The speeds profiles 42 and 43 for the first and second emitting materials are respectively illustrated with different lengths of arrows as shown in FIG. 4. In the stage 47, the unequal speed profiles 42 and 43 for the first and second emitting materials are equalized into the equalized speed profiles 44 and 45 for the first and second emitting materials as shown in FIG. 4 after implementing the temperature tuning and compensation scheme.

Figure 5:
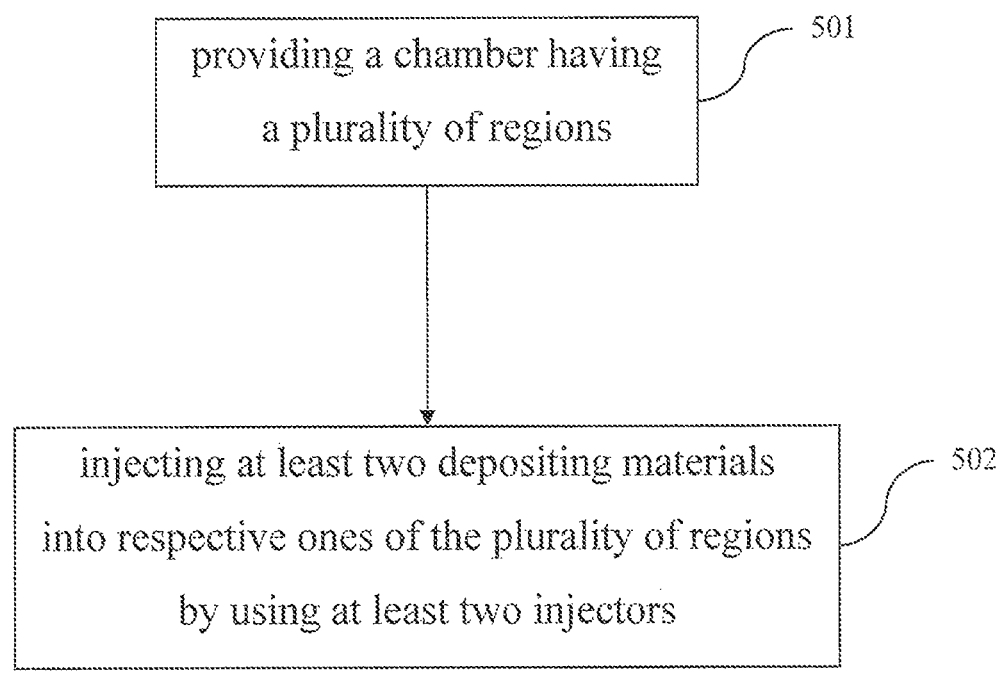
FIG. 5 is a flow chart illustrating the atomic layer deposition process having at least two depositing materials.

FIG. 5 is a flow chart illustrating an atomic layer deposition process having at least two depositing materials in accordance with various embodiments of the present disclosure. The process in FIG. 5 includes providing a chamber having a plurality of regions in step 501, injecting at least two depositing materials into respective ones of the plurality of regions by using at least two injectors in step 502. In this process, the at least two depositing materials are deposited through different injectors 14 and 15, as shown in FIG. 1, on the surface of the wafer substrate, wherein the depositing materials may have the same recipe. The depositing materials can range from Oxides, Nitrides, and Metals to Sulphides for the wafers located within the mentioned plurality of regions 11 in FIG. 1. These steps show how to perform the layer deposition process.

Figure 6:
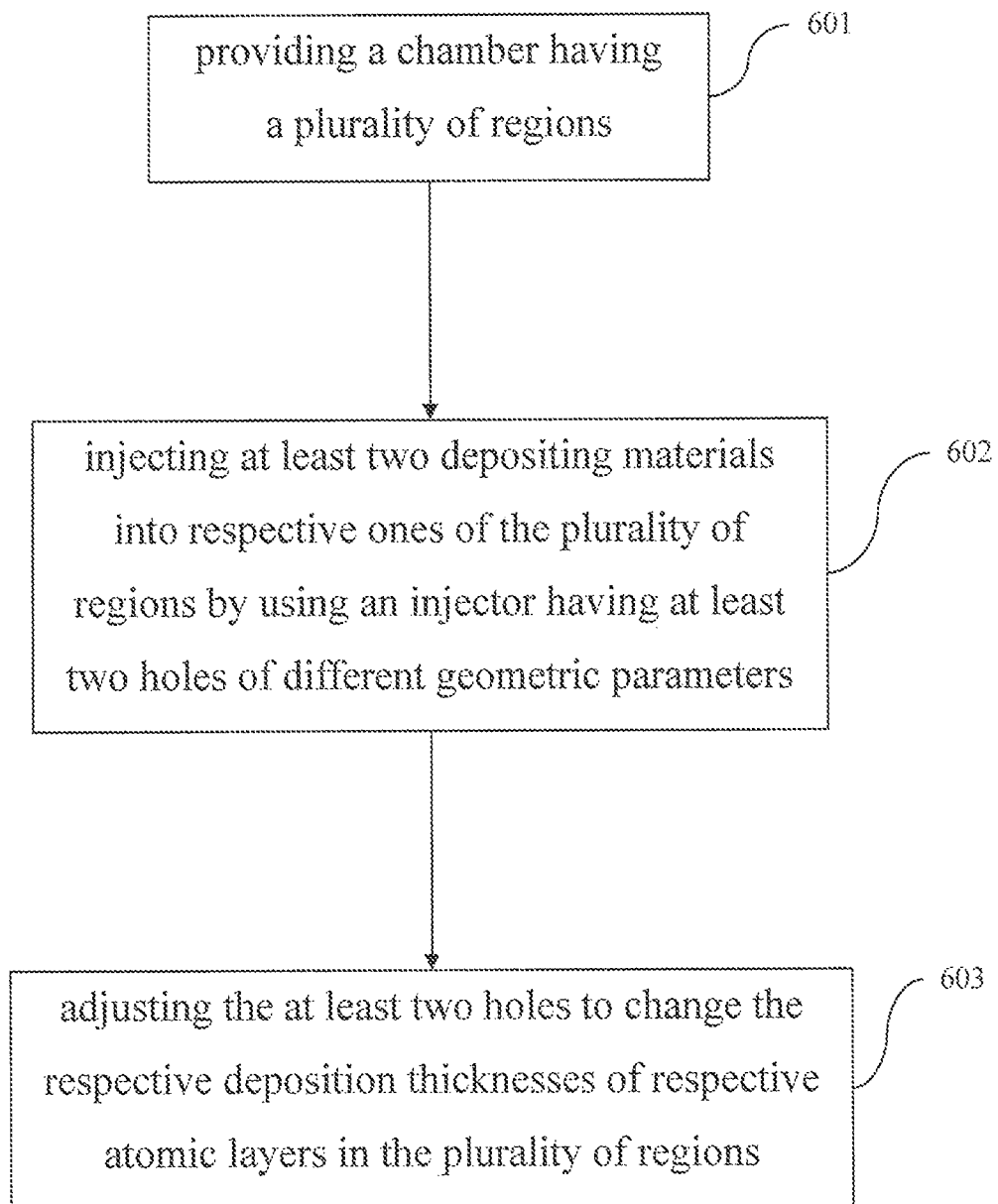
FIG. 6 is a flow chart illustrating the atomic layer deposition process having at least two holes of different geometric parameters.

FIG. 6 is a flow chart illustrating another atomic layer deposition process in accordance with various embodiments of the present disclosure. The process in FIG. 6 includes providing a chamber having a plurality of regions in step 601, injecting at least two depositing materials into respective ones of the plurality of regions by using an injector having at least two holes of different geometric parameters in step 602, and adjusting the at least two holes to change the respective deposition thicknesses of respective atomic layers in the plurality of regions in step 603. In some embodiments, the geometric parameters represent a size, a shape, an area and so on, and the adjustment is accomplished by replacing the injector or modifying the holes of the injector. The at least two holes of different sizes can be used to produce the different deposition thicknesses for atomic layers in the corresponding regions. In addition, the at least two depositing materials may have the same recipe or different recipes.

Figure 7:
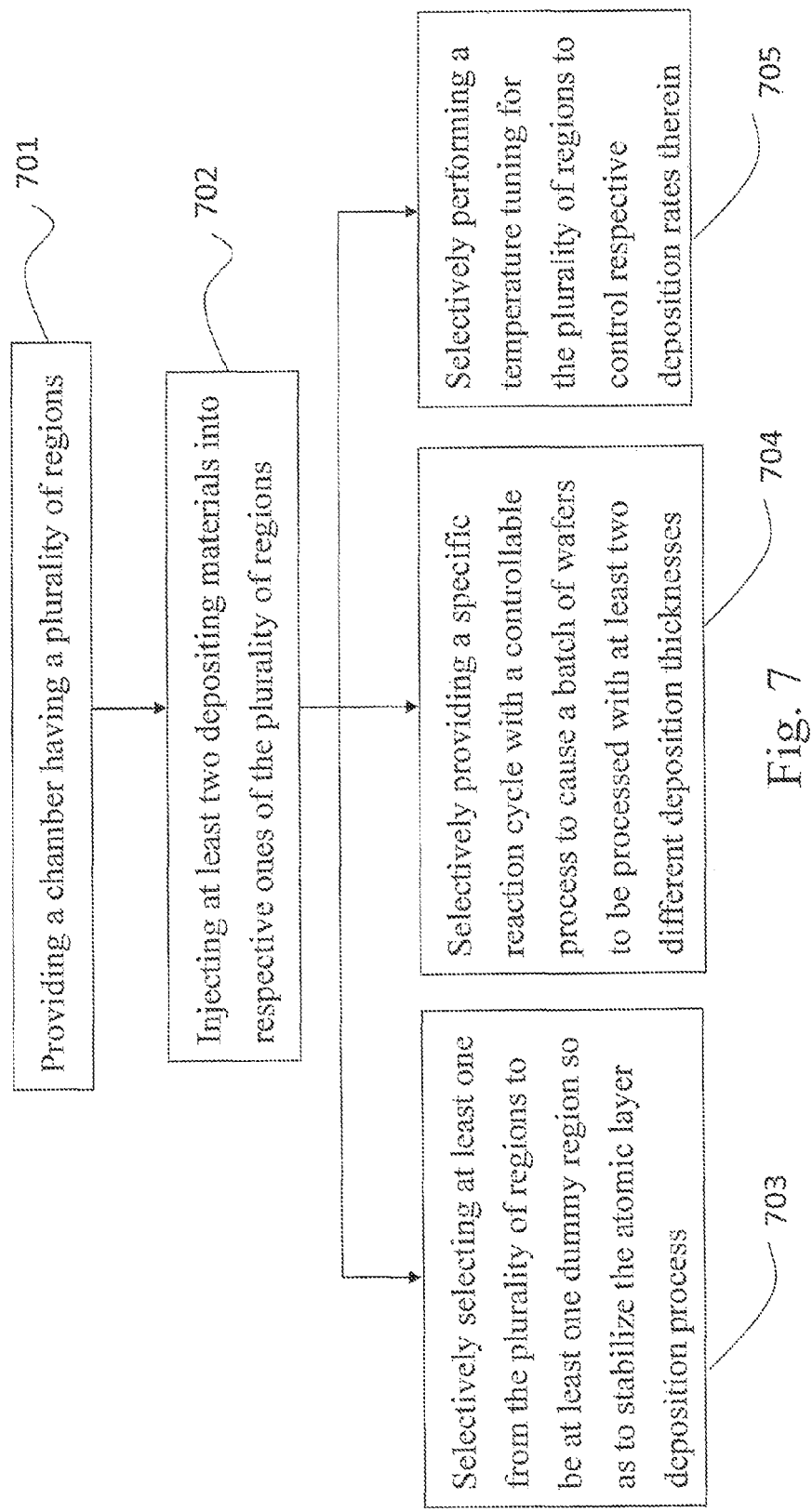
FIG. 7 is a flow chart illustrating the atomic layer deposition process performing a temperature tuning for the plurality of regions.

FIG. 7 is a flow chart illustrating yet another atomic layer deposition process in accordance with various embodiments of the present disclosure. The process in FIG. 7 includes two basic steps of providing a chamber having a plurality of regions in step 701, and injecting at least two depositing materials into respective ones of the plurality of regions in step 702. In some embodiments, steps 703, 704 and 705 follow the step 702 for the process. In step 703, at least one from the plurality of regions is selected to be at least one dummy region and the dummy region functioning as a buffer is configured between the two regions for the respective depositing materials, so that the atomic layer deposition process is stabilized. In step 704, a specific reaction cycle with a controllable process is provided to cause the wafers in the different regions to have different deposition thicknesses, namely a batch of wafers is processed with at least two different deposition thicknesses. In step 705, a temperature tuning is performed for the plurality of regions, and the plurality of regions have different temperatures to control respective deposition rates therein.

The above-mentioned controllable dummy cycle and the dummy region in cooperation with a temperature tuning scheme and acting as a buffer cycle and a buffer region that can respectively align multiple different processing times and exhibit imprecise separation is introduced into the ALD process, which enables a formation of two different thicknesses of the deposition layer within one batch of the ALD process. Thus, the introduced dummy region, the above controllable process, and the temperature tuning upgrade the productivity and the capacity utilization performance for the ALD process.

While the disclosure has been described in terms of what are presently considered to be the most practical and preferred embodiments, it is to be understood that the disclosure need not be limited to the disclosed embodiments. On the contrary, it is intended to cover various modifications and similar arrangements included within the spirit and scope of the appended claims, which are to be accorded with the broadest interpretation so as to encompass all such modifications and similar structures. Therefore, the above description and illustration should not be taken as limiting the scope of the present disclosure which is defined by the appended claims.

What is claimed is:

1. An atomic layer deposition apparatus, comprising:
   a chamber including a plurality of vertically offset regions;
   a heating device providing specific temperature ranges for the plurality of regions; and
   an injector having a gas flow path, the gas flow path including a first hole with a first geometric parameter and a second hole with a second geometric parameter different from the first geometric parameter, the injector being adapted to deliver precursor gas at a first gaseous flow rate in a first region of the plurality of region to form a first film at a first deposition rate and to simultaneously deliver precursor gas at a second gaseous flow rate in a second region of the plurality of regions to form a second film at a second deposition rate different than the first deposition rate, the first film and the second film being of the same composition; and
   a second injector having a second gas flow path, the second gas flow path including a third hole with a third geometric parameter and a fourth hole with a fourth geometric parameter different from the third geometric parameter, the second injector being adapted to deliver a second precursor gas at a third gaseous flow rate in the first region of the plurality of regions to form the first film at the first deposition rate and to simultaneously deliver the second precursor gas at a fourth gaseous flow rate in the second region of the plurality of regions to form the second film at the second deposition rate different than the first deposition rate, the first film and the second film being of the same composition.

2. The atomic layer deposition apparatus according to claim 1 further comprising a second injector within the chamber and extending through the first region and the second region, the second injector having including a plurality of third holes each with a third geometric parameter and a plurality of second fourth each with a fourth second geometric parameter different from the third geometric parameter, the second injector being adapted to deliver a second precursor gas at a third gaseous flow rate in the first region to form the first film at a first deposition rate and to deliver precursor gas at a second gaseous flow rate in the second region to form the second film at a second deposition rate different than the first deposition rate.

3. The atomic layer deposition apparatus according to claim 2 further comprising plural injectors located in the chamber, wherein each injector has a bore having a specific geometric parameter.

4. The atomic layer deposition apparatus according to claim 3, wherein the plural injectors are adapted to control a plurality of reaction cycles by the respective specific geometric parameters for respective deposition thicknesses in a wafer layer deposition process, and a batch of wafers are provided to the chamber before the wafer layer deposition process begins.

5. The atomic layer deposition apparatus according to claim 4, further comprising a plurality of heaters configured to perform a temperature tuning for the plurality of regions respectively for one of the plurality of reaction cycles in the wafer layer deposition process, and wherein the chamber provides at least one precursor being pulsed onto the batch of wafers during the wafer layer deposition process.

6. The atomic layer deposition apparatus according to claim 5, wherein each precursor has a thermal stability below a predefined deposition temperature, and is used during the wafer layer deposition process for a self limiting growth.

7. The atomic layer deposition apparatus according to claim 4, wherein the plurality of regions further comprises a dummy region configured to stabilize the wafer layer deposition process.

8. An atomic layer deposition apparatus, comprising:
   a chamber including a plurality of regions having at least a first region and a second region vertically offset from the first region, the first region adapted to produce a first film having a first thickness, and the second region adapted to produce a second film having a second thickness different from the first thickness simultaneously with production of the first film having the first thickness, the first film and second film having the same composition; and
   an injector having a gas flow path, the gas flow path including a first hole with a first geometric parameter and a second hole with a second geometric parameter different from the first geometric parameter, the injector being adapted to deliver precursor gas at a first gaseous flow rate in the first region to form the first film at a first deposition rate and to simultaneously deliver precursor gas at a second gaseous flow rate in the second region to form the second film at a second deposition rate different than the first deposition rate; and
   a second injector having a second gas flow path, the second gas flow path including a third hole with a third geometric parameter and a fourth hole with a fourth geometric parameter different from the third geometric parameter, the second injector being adapted to deliver a second precursor gas at a third gaseous flow rate in the first region to form the first film at the first deposition rate and to deliver the second precursor gas at a fourth gaseous flow rate in the second region to form the second film at the second deposition rate different than the first deposition rate.

9. The atomic layer deposition apparatus according to claim 8, wherein one of the first hole and the second hole corresponds to a specific one of the plurality of regions.

10. The atomic layer deposition apparatus according to claim 9 further comprising, a plurality of heaters respectively corresponding to the plurality of regions to control respective deposition thicknesses of respective atomic layers in the plurality of regions.

11. The atomic layer deposition apparatus according to claim 10, wherein the plurality of regions further comprise at least one dummy region adapted stabilize a deposition process at a rate intermediate a deposition process in the first region and a deposition process in the second region.

12. The atomic layer deposition apparatus according to claim 8, wherein the first and second geometric parameters are selected from the group consisting of hole size, hole shape, and hole area, and combinations thereof.

13. An atomic layer deposition apparatus, comprising:
a chamber adapted to simultaneously deposit a first film having a first thickness on each of a plurality of first wafers located in a first region of the chamber, and a second film having a second thickness different from the first thickness on each of a plurality of second wafers located in a second region of the chamber vertically offset from the first region of the chamber, both the first and second film being deposited in a same period of time and both the first film and second film being of the same composition; and
an injector within the chamber and extending through the first region and the second region, the injector including a plurality of first holes each with a first geometric parameter and a plurality of second holes each with a second geometric parameter different from the first geometric parameter, the injector being adapted to deliver a precursor gas at a first gaseous flow rate in the first region to form the first film at a first deposition rate and to deliver precursor gas at a second gaseous flow rate in the second region to form the second film at a second deposition rate different than the first deposition rate; and
a second injector within the chamber and extending through the first region and the second region, the second injector including a plurality of third holes each with a third geometric parameter and a plurality of fourth holes each with a fourth geometric parameter different from the third geometric parameter, the second injector being adapted to deliver a second precursor gas at a third gaseous flow rate in the first region to form the first film at the first deposition rate and to deliver the second precursor gas at a fourth gaseous flow rate in the second region to form the second film at the second deposition rate different than the first deposition rate.

14. The atomic layer deposition apparatus according to claim 13 further comprising a first heater within the chamber corresponding to the first region and a second heater within the chamber corresponding to the second region, wherein the first heater is adapted to cause the first film to be deposited at the first deposition rate and the second heater is adapted to cause the second film to be deposited at the second deposition rate.

15. The atomic layer deposition apparatus according to claim 13 further comprising a second injector within the chamber and extending through the first region and the second region, the second injector including a plurality of third holes each with a third geometric parameter and a plurality of fourth holes each with a fourth geometric parameter different from the third geometric parameter, the second injector being adapted to deliver a second precursor gas at a third gaseous flow rate in the first region to form the first film at a first deposition rate and to deliver the second precursor gas at a fourth gaseous flow rate in the second region to form the second film at a second deposition rate different than the first deposition rate.

16. The atomic layer deposition apparatus according to claim 13 further comprising a dummy region interjacent the first region and the second region.

17. The atomic layer deposition apparatus according to claim 13 wherein the first film and the second film are both selected from the group consisting of $Al_2O_3$, $HfO_2$, and $ZrO_2$.

18. The atomic layer deposition apparatus according to claim 13 wherein the chamber is a vacuum chamber.

* * * * *